US011776614B2

(12) United States Patent
Kim et al.

(10) Patent No.: US 11,776,614 B2
(45) Date of Patent: *Oct. 3, 2023

(54) MEMORY SYSTEM, DATA PROCESSING SYSTEM AND METHOD OF OPERATING THE SAME

(71) Applicant: SK hynix Inc., Gyeonggi-do (KR)

(72) Inventors: Hyeong Soo Kim, Gyeonggi-do (KR); Soo Hong Ahn, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/677,640

(22) Filed: Feb. 22, 2022

(65) Prior Publication Data

US 2022/0180915 A1    Jun. 9, 2022

Related U.S. Application Data

(62) Division of application No. 16/371,945, filed on Apr. 1, 2019, now Pat. No. 11,514,972.

(30) Foreign Application Priority Data

May 4, 2018    (KR) .................... 10-2018-0051791

(51) Int. Cl.
*G06F 1/32*       (2019.01)
*G11C 11/408*   (2006.01)
(Continued)

(52) U.S. Cl.
CPC ........ *G11C 11/4082* (2013.01); *G06F 1/3287* (2013.01); *G06F 12/06* (2013.01);
(Continued)

(58) Field of Classification Search
CPC ............ G11C 11/4082; G11C 11/1697; G11C 11/1693; G06F 12/06; G06F 1/3287; G06F 1/3275
See application file for complete search history.

(56) References Cited

U.S. PATENT DOCUMENTS

2008/0080131 A1    4/2008 Hori et al.
2008/0133876 A1    6/2008 Kwon et al.
(Continued)

FOREIGN PATENT DOCUMENTS

CN        102651237 A        8/2012

OTHER PUBLICATIONS

Office Action for the Chinese Patent Application No. 201910328717.1 issued by the Chinese Patent Office dated Nov. 4, 2022.
(Continued)

*Primary Examiner* — Ernest Unelus
(74) *Attorney, Agent, or Firm* — IP & T GROUP LLP

(57) ABSTRACT

A data processing system may include a plurality of memory modules, a controller, a power supply and a plurality of switches. Each of the memory modules may include a plurality of pages. The controller may control operations of the memory modules. The power supply may provide the memory modules with a power. The switches may be arranged corresponding to each of the memory modules. The switches may be selectively driven in response to a switch drive signal from the controller.

7 Claims, 14 Drawing Sheets

(51) Int. Cl.
  *G11C 11/16*     (2006.01)
  *G06F 12/06*     (2006.01)
  *G06F 1/3287*    (2019.01)
  *G06F 1/3234*    (2019.01)

(52) U.S. Cl.
  CPC ...... *G11C 11/1693* (2013.01); *G11C 11/1697* (2013.01); *G06F 1/3275* (2013.01)

(56) References Cited

U.S. PATENT DOCUMENTS

| | | |
|---|---|---|
| 2014/0244960 A1 | 8/2014 | Ise et al. |
| 2016/0124490 A1 | 5/2016 | Kupermann et al. |
| 2017/0075610 A1* | 3/2017 | Choi .................... G06F 1/3275 |

OTHER PUBLICATIONS

Office Action issued by CNIPA for Application No. 201910328717. 1, dated May 27, 2023.

* cited by examiner

MEMORY SYSTEM, DATA PROCESSING SYSTEM AND METHOD OF OPERATING THE SAME

CROSS-REFERENCE TO RELATED APPLICATION(S)

This application is a division of U.S. patent application Ser. No. 16/371,945 filed on Apr. 1, 2019, which claims benefits of priority of Korean Patent Application No. 10-2018-0051791 filed on May 4, 2018. The disclosure of each of the foregoing application is incorporated herein by reference in its entirety.

BACKGROUND

1. Technical Field

Various embodiments of the present invention generally relates to a data processing system and a method of operating the same. Particularly, the embodiments relate to a data processing system including a memory board, and a method of operating the data processing system.

2. Related Art

A data center such as a server system or a data processing system may include a plurality of racks for holding various kinds of hardware or configurable resources. The hardware and the configurable resources in the data center may be referred to as a physical resources or disaggregate elements. Particularly, the physical resources may be pooled to form a virtual computing platform for performing various computing operations.

The physical resources may include memory boards with different kinds of memories. The different kinds of memories may be mounted on the memory board to form a memory module. A power supply may be provided to each of the memory boards. The power supply may supply power to all of the memory modules in the memory board.

Currently, the data processing systems include plurality of memory boards. Thus, when the data processing system goes into a power-up condition, the data processing system may consume a great amount of the power. Therefore, various manners for decreasing power consumption may be developed.

SUMMARY

In various exemplary embodiments of the present disclosure, a data processing system may include a plurality of memory modules including a plurality of pages, a controller for controlling operations of the memory modules, a power supply for providing the memory modules with a power, and a selection component including a plurality of switches connected to the plurality of memory modules, respectively, the selection component for selectively providing the power to a portion of the plurality of memory modules and to block the power to remaining memory modules in response to switch driving signals from the controller. The controller remaps the logical address to a physical address of a page of a power-on memory module when a logical address information for accessing a page of a power-off memory module is inputted to the controller.

In various exemplary embodiments of the present disclosure, in a method of operating a data processing system, the data processing system may include a plurality of memory modules, a plurality of switches corresponding to each of the memory modules, and a power supply connected with the switches to provide the memory modules with a power. The method comprises generating storage signals for classifying the memory modules into a powered-on memory module and a powered-off memory module in accordance with a request including a user option, selectively turning-on or turning-off the switches in response to the storage signals, and changing and updating page address information of the memory modules based on turn-on or turn-off results of the switches. Logic levels of the storage signals change according to at least one of an optional signal preset by an user, a ratio of available page of the powered-on memory module and a variable indicating whether a memory operation of the powered-on memory is performed.

In various exemplary embodiments of the present disclosure, in a memory system, the memory system may include memory modules, a power supply configured to provide a power, and a controller configured to selectively couple the power supply to the respective memory modules. The controller couples, when the system is powered on, the power supply to one or more among the memory modules while keeping the power supply and remaining memory modules decoupled. The controller couples, when the usage rate of the coupled memory modules exceeds a threshold, the power supply to the decoupled memory modules.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
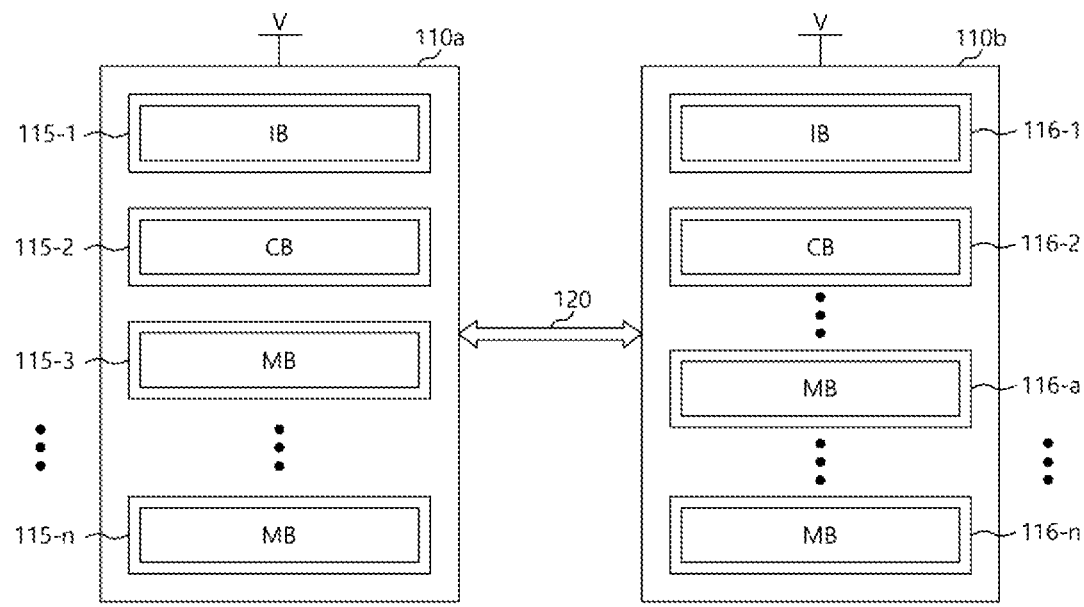
FIG. 1 is a block diagram illustrating a data processing system in accordance with an embodiment.

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

It is noted that reference to "an embodiment" does not necessarily mean only one embodiment, and different references to "an embodiment" are not necessarily to the same embodiment(s).

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

FIG. 1 is a block diagram illustrating a data processing system 100 in accordance with an embodiment.

Referring to FIG. 1, the data processing system 100 may include a plurality of computing racks 110a and 110b. The computing racks 110a and 110b may be interfaced with each other through a network 120.

The computing racks 110a and 110b may include a plurality of trays 115-1 to 115-n and 116-1 to 116-n. Various kinds of circuit boards (for example, denoted as IB, CB, MB in FIG. 1) may be inserted into each of the trays 115-1 to 115-n and 116-1 to 116-n.

By way of example and not limitation, each of the circuit boards inserted into the trays 115-1 to 115-n and 116-1 to 116-n may include an interconnection board IB, a computing board CB and a memory board MB. The number of the interconnecting boards IBs, the computing boards CBs, and the memory boards MBs inserted into the trays 115-1 to 115-n and 116-1 to 116-n may vary in accordance with the type of applications of the computing racks 110a and 110b.

The network 120 may transmit data between the computing racks 110a and 110b. The network 120 may include various wire or wireless networks. For example, the network 120 may include a wire or wireless local area network (LAN), a wide area network (WAN) cellular network and/or an internet. Further, the network 120 may include auxiliary network devices such as auxiliary computers, a router, a switch, etc.

FIG. 1 may depict the two computing racks 110a and 110b. However, the number of computing racks in the data processing system 100 may vary depending on design, for example, may include more than two computing racks.

Although not depicted in FIG. 1, the data processing system 100 may include a power system, a cooling system and input/output devices similar to a server system.

Further, the computing racks 110a and 110b may receive an external voltage V from an external power supply (not shown).

Figure 2:
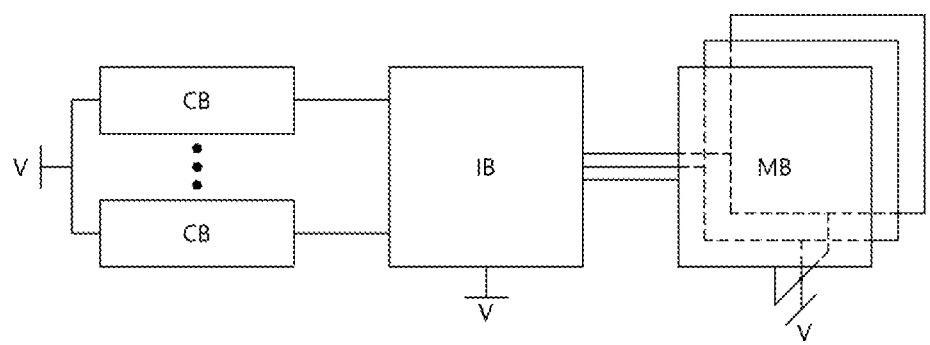
FIG. 2 is a view illustrating an internal structure of a computing rack in accordance with an embodiment.

FIG. 2 is a view illustrating an internal structure of the computing rack 110a or 110b in accordance with an embodiment.

Referring to FIG. 2, the computing rack 110a or 110b may include the computing board CB, the memory board MB and the interconnecting board IB. In the embodiment shown in FIG. 2, the computing rack 110a or 110b may include a plurality of computing boards CBs and a plurality of memory boards MBs. The interconnecting board IB may interface between the computing boards CB and the memory boards MB.

The computing board CB may include at least one processor, a processing control circuit or a central processing unit (CPU).

The memory board MB may include a volatile memory and/or a non-volatile memory having a module shape. By way of example and not limitation, the memory board MB may include a dynamic random access memory (DRAM), a flash memory, a memory card, a hard disk drive (HDD), a solid state drive (SSD), and/or any combinations thereof. The memory board MB may be divided, allotted, designated and controlled by requests from the computing board CB.

The interconnecting board CB may include network interface ports, cards or switches. The interconnecting board CB may use a protocol related to at least one wire or wireless communication technology for performing communications.

The computing board CB, the memory board MB and the interconnecting board IB may receive an external voltage V from an external power supply (not shown).

Figure 3:
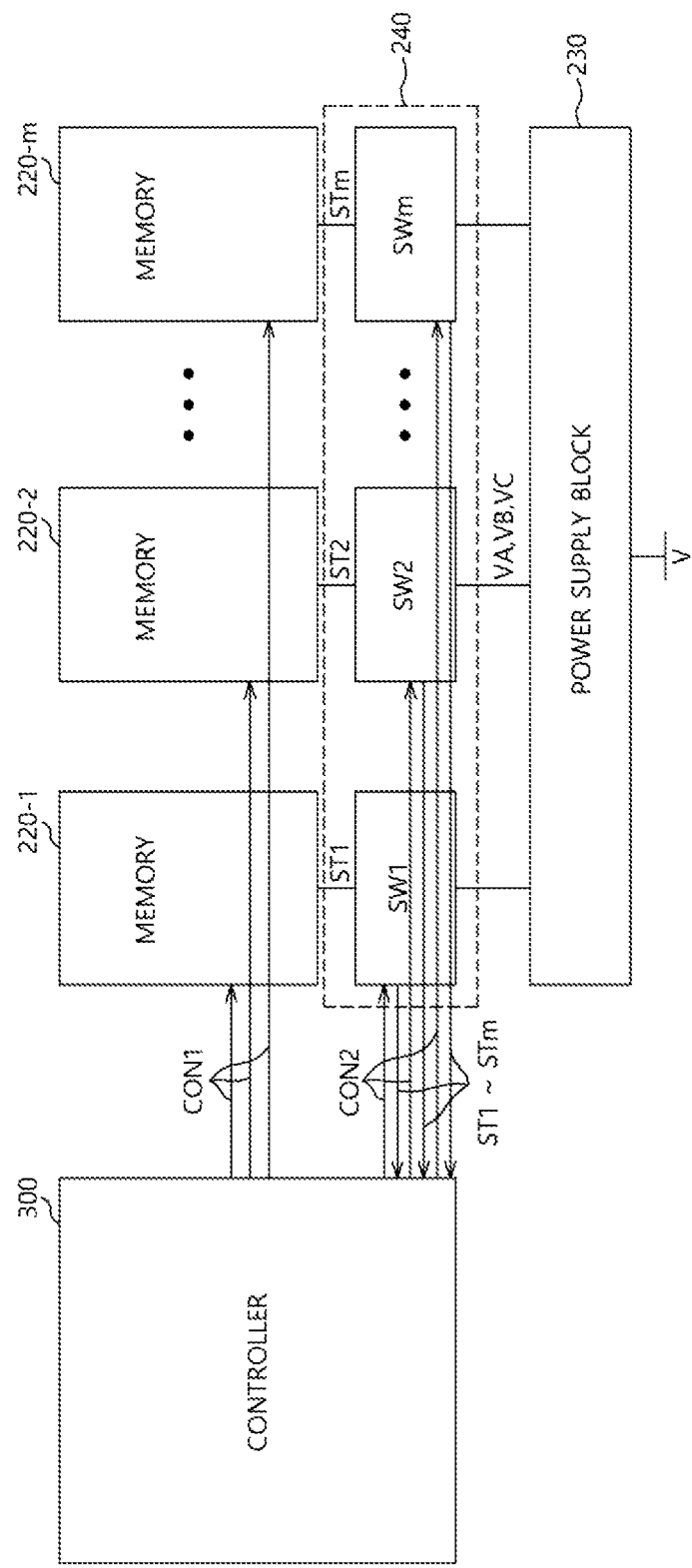
FIG. 3 is a block diagram illustrating a memory board in accordance with an embodiment.

FIG. 3 is a block diagram illustrating the memory board MB in accordance with an embodiment.

Referring to FIG. 3, the memory board MB may include a controller 300, a plurality of memory modules 220-1 to 220-m, a power supply 230 and a selection component 240.

The controller 300 may control the memory modules 220-1 to 220-m. For example, the controller 300 may output a first control signal CON1 for performing memory control operations such as selecting ones among the memory modules 220-1 to 220-m, storing data in selected memory modules and reading the stored data in the selected memory modules. The controller 300 may output to the selection component 240 a second control signal CON2 for selectively supplying a power to any one of the memory modules 220-1 to 220-m.

The memory modules 220-1 to 220-m may be same kind of memory devices or different kinds of memory devices. When the memory modules 220-1 to 220-m are of the same kind of the memory devices, the memory modules 220-1 to 220-m may be classified in detail according to a capacity or a latency. For example, the memory modules 220-1 to 220-m may include a plurality of pages.

The power supply 230 may receive the external voltage V from an external power supply (not shown). The power supply 230 may provide the selection component 240 with various power supply voltages VA, VB and VC for operating the memory modules 220-1 to 220-m. In an embodiment, the power supply 230 may generate the three power supply voltages VA, VB and VC. Alternatively, the power supply 230 may generate at least four power supply voltages.

Figure 4:
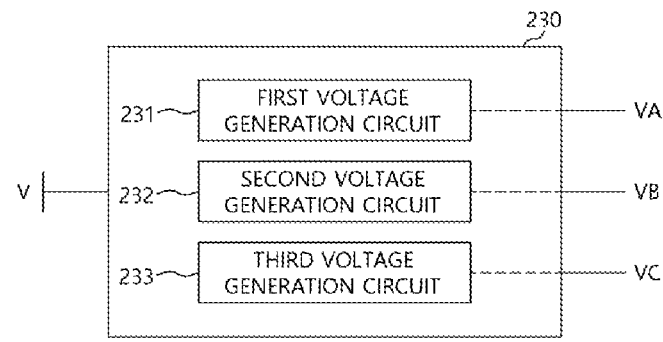
FIG. 4 is a block diagram illustrating a power supply in accordance with an embodiment.

FIG. 4 is a block diagram illustrating the power supply 230 in accordance with an embodiment.

Referring to FIG. 4, the power supply 230 may receive the external voltage V to generate the power supply voltages VA, VB and VC. The power supply 230 may output the power supply voltages VA, VB and VC to the selection component 240. For example, the power supply 230 may include first to third voltage generation circuits 231, 232 and 233. However, the configuration of the power supply 230 may not be limited to the above-mentioned structure. At least one of the first to third voltage generation circuits 231, 232 and 233 may include a voltage distribution circuit and/or a voltage regulator circuit.

Referring again to FIG. 3, the selection component 240 may receive the power supply voltages VA, VB and VC from the power supply 230. The selection component 240 may provide one or more of the memory modules 220-1 to 220-m with the power supply voltages VA, VB and VC.

The selection component 240 may include a plurality of switches SW1 to SWm respectively corresponding to the memory modules 220-1 to 220-m. The switches SW1 to SWm may be connected between the power supply 230 and the memory modules 220-1 to 220-m. The switches SW1 to SWm may be selectively turned-on in response to the second control signal CON2 from the controller 300. Through driving of the switches SW1 to SWm, the power supply 230 and the memory modules 220-1 to 220-m may be electrically connected with each other so that the memory modules 220-1 to 220-m may receive the power supply voltages VA, VB and VC, i.e., the power. The plurality of memory modules are classified powered-on memory modules and powered-off memory modules according to selectively driving of the switches SW1 to SWm.

The switches SW1 to SWm may include a MOS transistor (not shown) or a transfer transistor (not shown). However, the present invention is not limited to MOS transistors or transfer transistors. That is, various switching elements may be used as the switches SW1 to SWm.

Figure 5:
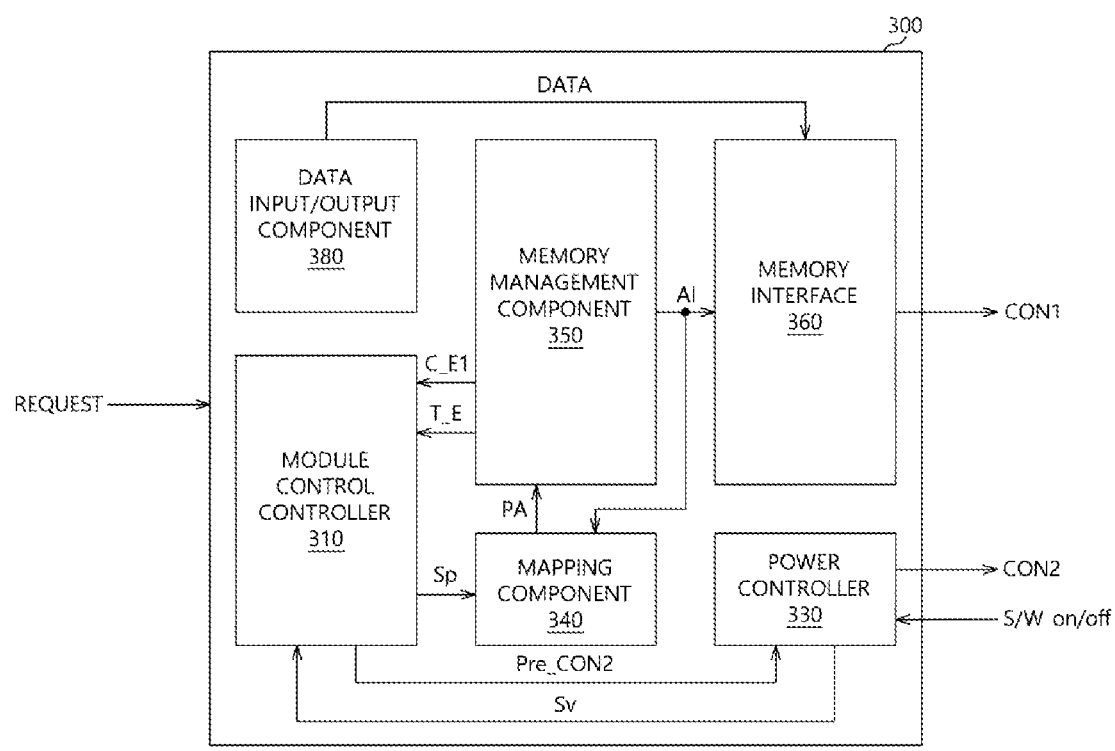
FIG. 5 is a block diagram illustrating a controller in accordance with an embodiment.

FIG. 5 is a block diagram illustrating the controller 300 in accordance with an embodiment.

Referring to FIG. 5, the controller 300 may include a module controller 310, a power controller 330, a mapping component 340, a memory management component 350, a data input/output component 380 and a memory interface 360.

The controller 300 may receive a request REQUEST. The request REQUEST may be provided from the computing board CB or a single host. The request REQUEST may include a user option. The user option may include a power supply instruction that the power is supplied to one or more of the memory modules 220-1 to 220-m in response to a power-up command. For example, the information of the user option may include a power supply instruction of supplying the power to about 70% of the memory modules 220-1 to 220-m.

Figure 6:
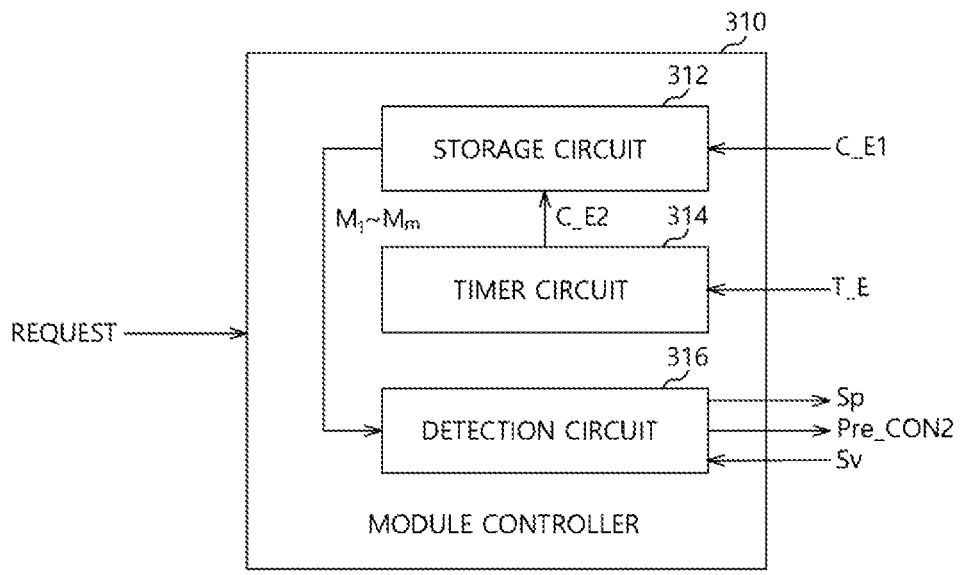
FIG. 6 is a block diagram illustrating a module controller in accordance with an embodiment.

FIG. 6 is a block diagram illustrating the module controller 310 in accordance with an embodiment.

Referring to FIG. 6, the module controller 310 may receive the request REQUEST including the user option signal. The module controller 310 may provide the power controller 330 with a preliminary control signal Pre_CON2 (described in more detailed below) in response to the request REQUEST. The module controller 310 may receive a verification signal Sv (described in more detailed below) from the power controller 330.

The module controller 310 may include a storage circuit 312, a timer circuit 314 and a detection circuit 316.

The storage circuit 312 may receive the request REQUEST including the user option signal to generate and output a plurality of storage signals M1 to Mm for representing power on/off states of the memory modules 220-1 to 220-m. Levels of the storage signals M1 to Mm may be changed in accordance with the user option signal. The power-on or the power-off of the memory modules 220-1 to 220-m may be determined in accordance with the levels of the storage signals M1 to Mm. For example, the storage circuit 312 may include a register for temporarily storing power on/off information in accordance with the user option signal. In an embodiment, the storage circuit 312 may output the storage signals M1 to Mm having numbers corresponding to those of the memory modules 220-1 to 220-m. In an embodiment, the storage circuit 312 may output an m-bit signal (m is the number of the memory modules 220-1 to 220-m).

The storage circuit 312 may receive a first power control signal C_E1 from the memory management component 350. When the enabled first power control signal C_E1 is input (that is, the storage circuit 312 receives the first power control signal CE_1 from the memory management component 350), the storage circuit 312 may change the levels of all the storage signals M1 to Mm to a high level. The storage circuit 312 may provide the detection circuit 316 with the storage signals M1 to Mm indicating the high level. The storage circuit 312 may change the levels of the storage signals M1 to Mm in response to a second power control signal C_E2 provided from the timer circuit 314.

The timer circuit 314 may be driven in response to a timer drive signal T_E provided from the memory management component 350. The timer drive signal T_E may be generated based on page access information of the memory modules 220-1 to 220-m. The page access information (described in more detail below) may be generated from the memory management component 350.

For example, when a page access information of a specific memory module may be inputted, the memory management component 350 may enable the timer drive signal T_E. When another page of the specific memory module is accessed, the memory management component 350 may reset the timer drive signal T_E. The memory management component 350 may then enable the reset timer drive signal T_E.

The timer circuit 314 may be driven in response to the timer drive signal T_E. When the updated timer drive signal T_E is not inputted into the timer circuit 314 (i.e., the page of the specific memory module is not further accessed) during a time set by the timer circuit 314, the timer circuit 314 may provide the storage circuit 312 with the second power control signal C_E2. For example, the second power control signal C_E2 may represent that memory operation to all pages of the specific memory module is completed and thus the specific memory module is currently idle. The storage circuit 312 may change the levels of the storage signals M1 to Mm of the specific memory module according to the second power control signal C_E2.

Figure 7:
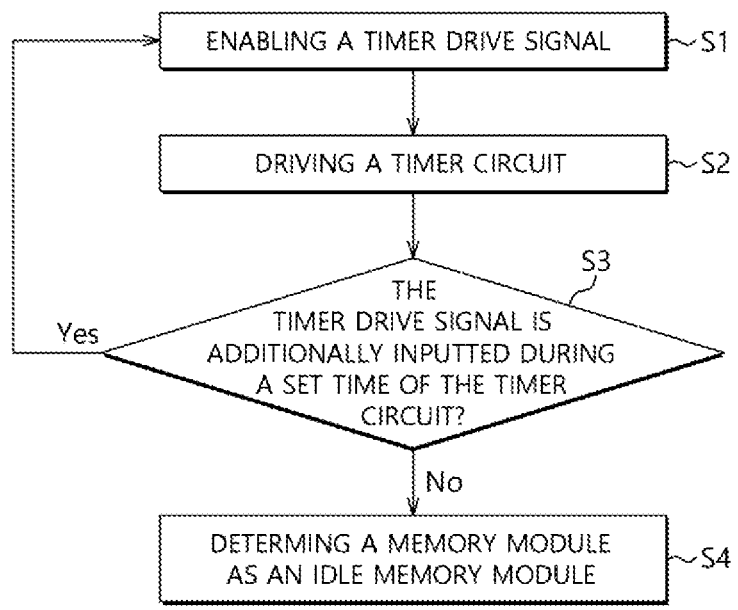
FIG. 7 is a flow chart describing operations of a timer in accordance with an embodiment.

FIG. 7 is a flow chart describing operations of a timer in accordance with an embodiment.

Referring to FIGS. 6 and 7, in step S1, the memory management component 350 may enable the timer drive signal T_E in response to the page access information of a specific one among the memory modules 220-1~ to 220-m.

In step S2, when the timer drive signal T_E is enabled, the timer circuit 314 may be driven.

In step S3, the timer circuit 314 determines whether the enabled timer drive signal T_E may be additionally inputted or not, during the set time of the timer circuit 314. That is, the timer circuit 314 determines whether the page access information for accessing the pages in the specific memory module is changed (generated) or not during the set time of the timer circuit 314.

In step S4, when the enabled timer drive signal T_E is not additionally inputted (that is, "No" at step S3), the timer circuit 314 may determine the specific memory module as an idle memory module. In contrast, when the enable timer drive signal T_E is additionally inputted during the set time (that is, "Yes" at step S3), a new time may be set by the timer circuit 314. The above-mentioned steps S1 to S4 may then be repeated.

Referring again to FIG. 6, the detection circuit 316 may receive the storage signals M1 to Mm from the storage circuit 312. The detection circuit 316 may generate the preliminary control signal Pre_CON2 for driving the power controller 330 based on the storage signals M1 to Mm. The detection circuit 316 may receive the verification signal Sv from the power controller 330.

Figure 8:
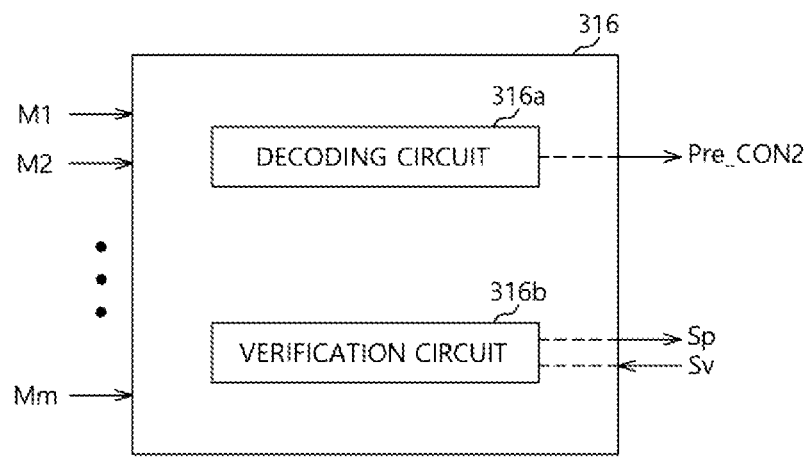
FIG. 8 is a block diagram illustrating a detection circuit in accordance with an embodiment.

FIG. 8 is a block diagram illustrating the detection circuit 316 in accordance with an embodiment.

Referring to FIG. 8, the detection circuit 316 may receive the storage signals M1 to Mm, into which the power on/off information of the memory modules 220-1 to 220-m is reflected. The detection circuit 316 may generate the preliminary control signal Pre_CON2 for determining numbers of the switches to be driven among the switches SW1 to SWm of the selection component 240 in accordance with the storage signals M1 to Mm of the storage circuit 312. The detection circuit 316 may include a decoding circuit 316a for receiving the storage signals M1 to Mm to generate the preliminary control signal Pre_CON2.

The detection circuit 316 may further include a verification circuit 316b. The verification circuit 316b may receive and buffer the verification signal Sv from the power controller 330. The verification circuit 316b may output the buffered verification signal Sv as a power information signal Sp to the mapping component 340.

Figure 9:
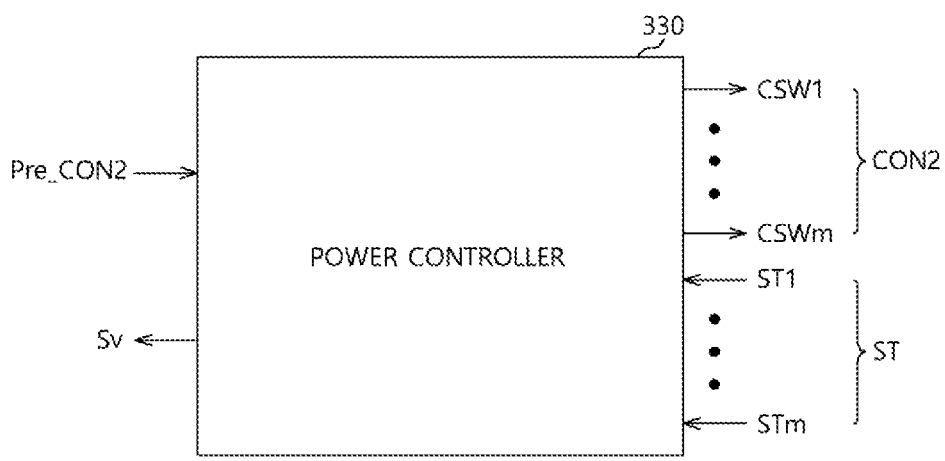
FIG. 9 is a block diagram illustrating a power controller in accordance with an embodiment.

FIG. 9 is a block diagram illustrating the power controller 330 in accordance with an embodiment.

Referring to FIG. 9, the power controller 330 may receive the preliminary control signal Pre_CON2 to generate a plurality of switch drive signals CSW1 to CSWm. The switch drive signals CSW1 to CSWm may correspond to the second control signal CON2 in FIG. 5. The switch drive signals CSW1 to CSWm may be inputted into the switches SW1 to SWm of the selection component 240. The switches SW1 to SWm may be selectively driven by the switch drive signals CSW1 to CSWm. The power controller 330 may include a decoding circuit (not shown) for generating the switch drive signals CSW1 to CSWm. The decoding circuit may have various configurations.

The power controller 330 may receive switch on/off information ST1 to STm (referring to FIG. 3) from the selection component 240. The power controller 330 may decode the switch on/off information ST1 to STm to output the decoded switch on/off information as the verification signal Sv. The verification signal Sv may be inputted into the detection circuit 316.

Referring again to FIG. 5, the mapping component 340 may receive the power information signal Sp from the module controller 310. The mapping component 340 may update a page address of a mapping table based on the power information signal Sp.

Figure 10:
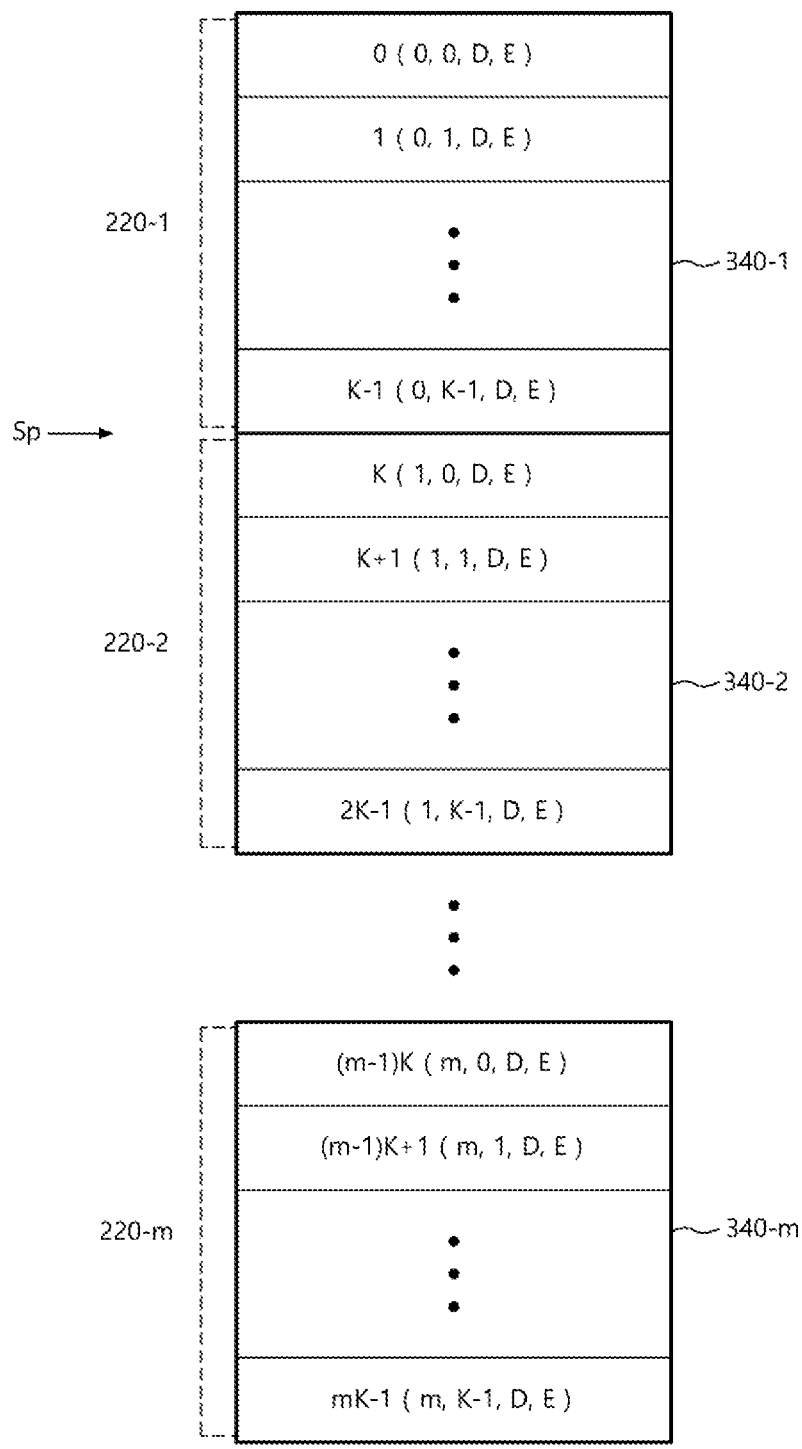
FIG. 10 is a block diagram illustrating a mapping component in accordance with an embodiment.

FIG. 10 is a block diagram illustrating the mapping component 340 in accordance with an embodiment.

Referring to FIG. 10, the mapping component 340 may include mapping tables 340-1 to 340-m respectively corresponding to the memory modules 220-1 to 220-m. For example, a first mapping table 340-1 may correspond to the first memory module 220-1. An mth mapping table 340-m may correspond to the mth memory module 220-m.

Each of the mapping tables 340-1 to 340-m may be divided into K numbers of pages 0 to K−1 (where K is an integer greater than 1). An address of each of the pages may be designated by a following manner. It is assumed that each of the memory modules 220-1 to 220-m is also divided into K numbers of pages 0 to K−1.

TABLE 1

| Page address: A (B, C, D, E) | |
|---|---|
| A | Page of the mapping component 340 |
| B | Memory module |
| C | Page of the memory module |
| D | Use (data storage) |
| E | Power on/off |

For example, when the page address is K+1 (1, 1, 0, 1), information that a second page (C=1) of the second memory module (B=1) is not used (D=0) and is powered on (F=1) is registered in the (k+1)th page (A=K+1) of the mapping component 340.

The mapping component 340 may update the page address, particularly the power on/off information of the memory modules 220-1 to 220-*m* in the mapping table 340-1 to 340-*m*, in response to the power information signal Sp. For example, when the power information signal Sp, indicating that the mth memory module 220-*m* is the power off memory module, is inputted into the mapping component 340, the address variable E of the mth mapping table 340-*m* corresponding to the mth memory module 220-*m* may be updated into "0".

The mapping component 340 may receive the physical address information AI corresponding to read/write address provided from the memory management component 350 to update data storage information D of the page address.

Figure 11:
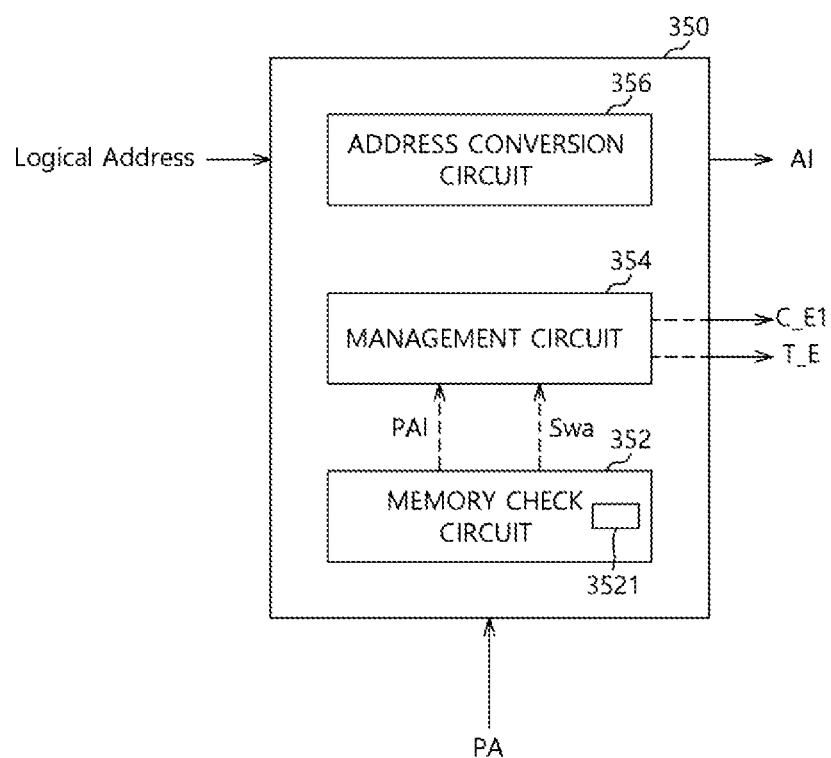
FIG. 11 is a block diagram illustrating a memory management component in accordance with an embodiment.

FIG. 11 is a block diagram illustrating the memory management component 350 in accordance with an embodiment.

Referring to FIG. 11, the memory management component 350 may include a memory check circuit 352, a management circuit 354 and an address conversion circuit 356.

The memory check circuit 352 may count and monitor a number of available pages, which have available storage space to store data, among the pages of the memory modules 220-1 to 220-*m*. For example, the memory check circuit 352 may count the number of the available pages of powered-on memory modules among the memory modules 220-1 to 220-*m* using the page address information PA of the mapping table 340-1 to 340-*m* in the mapping component 340. The page address information PA includes "C", "D" and "E" of the page address of the table 1. When an available page ratio of the powered-on memory module, i.e., a ratio of the number of the available pages to total number of pages in the powered-on memory modules does not exceed a critical value, which may be for example, about 30%, the memory check circuit 352 may provide the management circuit 354 with a warning signal Swa. The memory check circuit 352 may generate the page access information PAI based on the page address information PA of the mapping component 340. For example, the page access information PAI may be generated by a detector 3521 for detecting changes of the variables B, C and D of the page address in the mapping component 340. The detector 3521 may be installed in the memory check circuit 352. Alternatively, the detector 3521 may be separately provided in the memory management component 350.

When the warning signal Swa is inputted into the management circuit 354, the management circuit 354 may generate a first power control signal C_E1 for controlling changes of output levels of the storage signals M1 to Mm of the storage circuit 312. The management circuit 354 may generate the timer drive signal T_E based on the page access information PAI of the memory modules 220-1 to 220-*m*.

The address conversion circuit 356 may receive logical address from the computing board CB or the host. The address conversion circuit 356 may remap the logical address to the physical address information AI and transmit to the memory interface 360 the physical address information AI for selecting pages of the powered-on memory modules among the memory modules 220-1 to 220-*m*.

As shown in FIG. 5, the memory interface 360 may receive the physical address information AI from the memory management component 350 and the data DATA from the data input/output component 380. The memory interface 360 may generate the first control signal CON1 based on the physical address information AI and the data DATA. The memory interface 360 may provide the memory modules 220-1 to 220-*m* with the first control signal CON1.

Hereinafter, operations of the data processing system 100 will be illustrated in more detail according to sequences.

First Sequence: Method of Applying a Power to One or More of the Memory Modules

Figure 12:
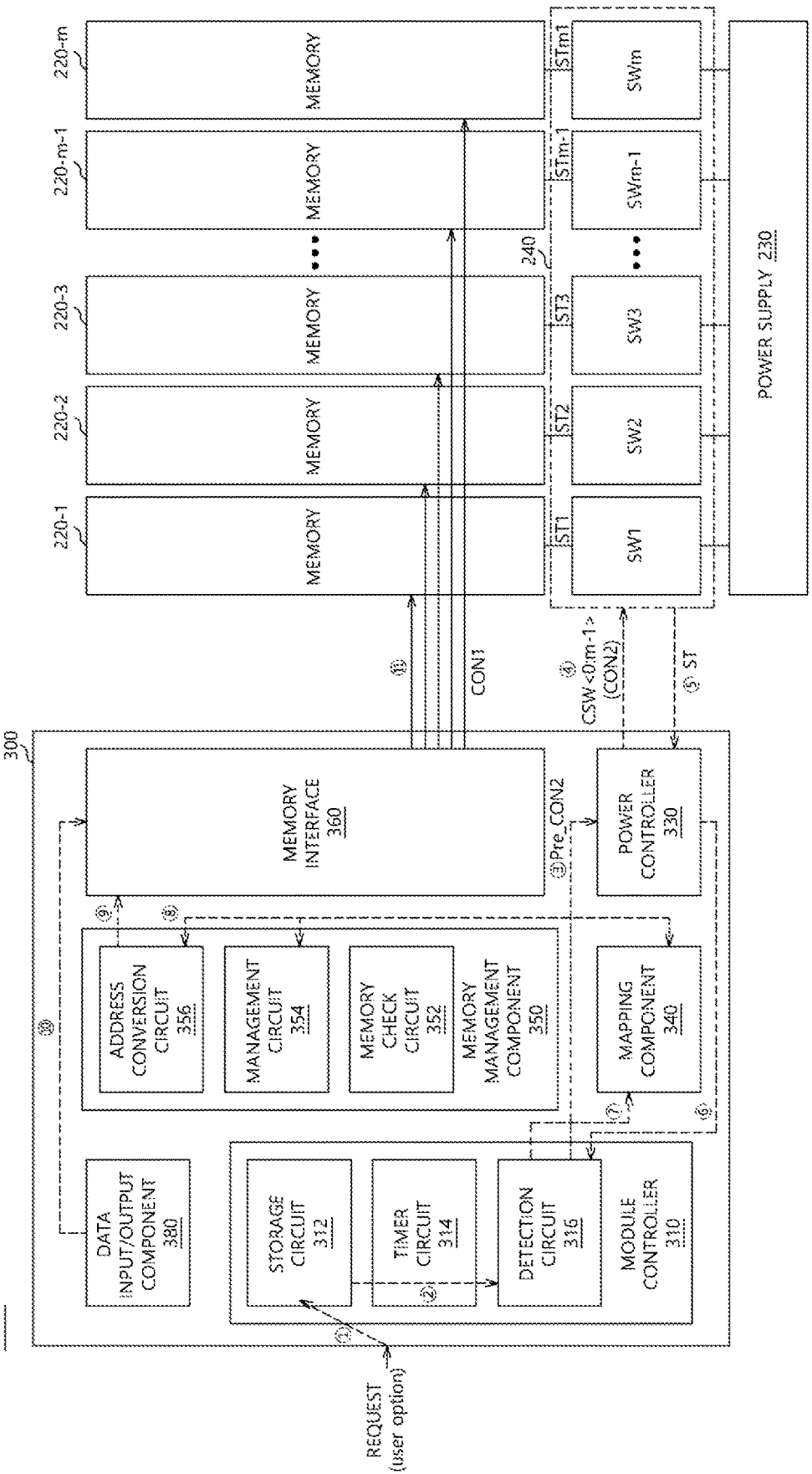
FIG. 12 is a block diagram illustrating a sequence for providing any one of memory modules with a power in accordance with an embodiment.
Figure 13:
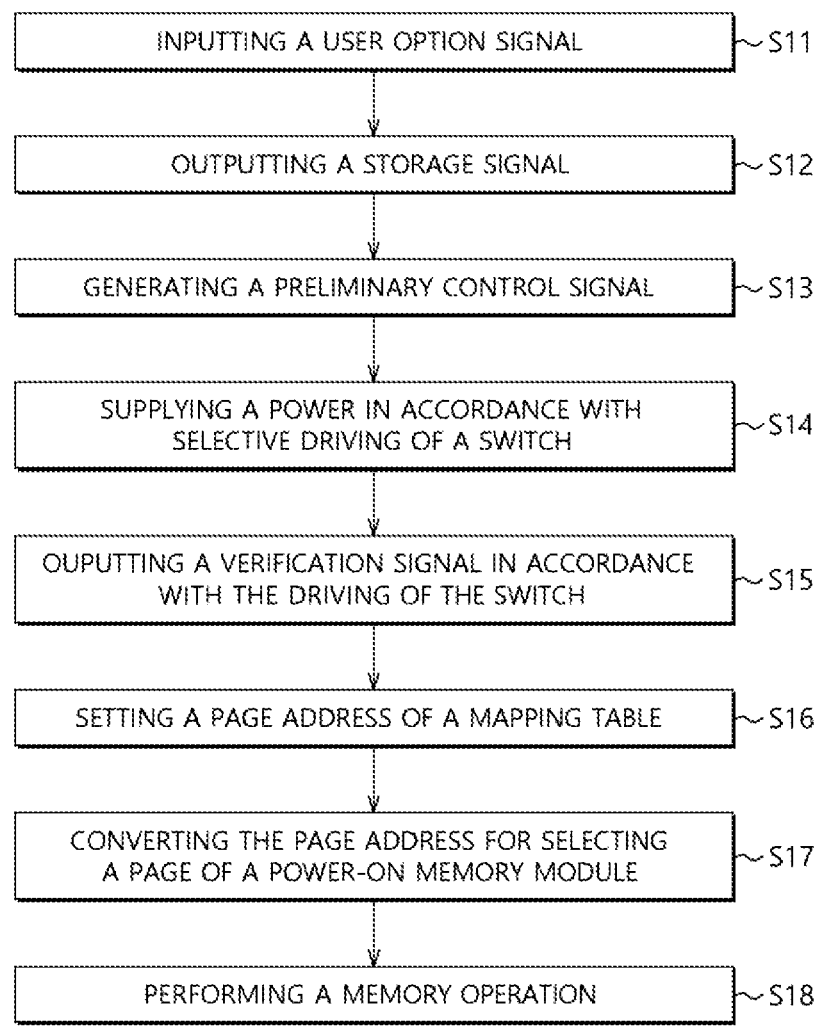
FIG. 13 is a flow chart describing operations for providing any one of memory modules with a power in accordance with an embodiment.

FIG. 12 is a block diagram illustrating a sequence for providing any one of memory modules with a power in accordance with an embodiment, and FIG. 13 is a flow chart describing operations for providing any one of memory modules with a power in accordance with an embodiment.

Referring to FIGS. 12 and 13, in step S11, the user option included in the request REQUEST may be inputted into the storage circuit 312 of the controller 300 (see ① of FIG. 12). For example, when memory modules 220-1 to 220-*m* are powered up, the user option signal may include an option for providing power to about 70% of the total memory modules 220-1 to 220-*m*.

In step S12, the storage circuit 312 of the controller 300 may generate the storage signals M1 to Mm for determining the power-on/off of the memory modules 220-1 to 220-*m* according to the user option signal. The storage circuit 312 may provide the detection circuit 316 with the storage signals M1 to Mm (see ② of FIG. 12).

In step S13, the detection circuit 316 may receive the storage signals M1 to Mm to generate the preliminary control signal Pre_CON2 for driving the power controller 330 (see ③ of FIG. 12). The preliminary control signal Pre_CON2 may be obtained by decoding the storage signals M1 to Mm.

In step S14, the power controller 330 may generate the switch drive signal CSW<1:m> in response to the preliminary control signal Pre_CON2. In an embodiment, the power controller 330 may generate the switch drive signal CSW<1:m> for disabling the switches SW1 to SWm corresponding to memory modules to be powered off in response to the preliminary control signal Pre_CON2. The power controller 330 may output the switch drive signal CSW<1:m> to the selection component 240 (see ④ of FIG. 12) to selectively enable ones among the switches SW1 to SWm. Only the memory modules 220-1 to 220-*m* connected to the enabled ones among the switches SW1 to SWm may selectively receive the power.

In step S15, the selection component 240 may provide the power controller 330 with the switch on/off information ST of the switches SW1 to SWm (see ⑤ of FIG. 12). The power controller 330 may decode the switch on/off information ST. The power controller 330 may provide the detection circuit 316 with the decoded on/off information ST as the verification signal Sv (see ⑥ of FIG. 12).

The verification circuit 316*b* of the detection circuit 316 may buffer the verification signal Sv. The verification circuit 316*b* may output the buffered verification signal Sv as the power information signal Sp for updating the mapping component 340.

In an embodiment, the storage signal M1 to Mm, the preliminary control signal Pre_CON2 and the verification signal Sv may include information for selectively driving the switches SW1 to SWm. When the preliminary control signal Pre_CON2 may be an ideal signal based on the storage signal M1 to Mm, the verification signal Sv may represent the on/off states of the switches SW1 to SWm. Thus, when the detection circuit 316, the power controller 330 and the selection component 240 do not have an error, the preliminary control signal Pre_CON2 may be substantially the same as the verification signal Sv. However, the mapping tables 340-1 to 340-*m* of the mapping component 340 should represent the status of power supplies to the memory modules 220-1 to 220-*m*. Therefore, the mapping component 340 may receive the verification signal Sv, i.e., the power information signal Sp in place of the preliminary control signal Pre_CON2 for generating the switch drive signal CSW<1:m> (see ⑦ of FIG. 12).

In step S16, the mapping component 340 may set the page address information on the mapping tables 340-1 to 340m based on the power information signal Sp. The mapping component 340 may set the page address variable E to be powered-off as "0" based on the power information signal Sp. The page address information PA may be transmitted to the address conversion circuit 356 of the memory management component 350 (see ⑧ of FIG. 12).

In step S17, the address conversion circuit 356 of the controller 300 may receive the logical address information and the page address information PA included in the request REQUEST. For example, if the logical address information may include information for accessing a page of the powered-off memory modules, the address conversion circuit 356 may remap the logical address information for accessing the page of the powered-on memory module. The address conversion circuit 356 may then transmit the physical address information AI for accessing the page of the powered-on memory module to the memory interface 360 (⑨ of FIG. 12). When the page address information PA may be inputted into the memory management component 350, the page address information PA may be periodically inputted into the memory check circuit 352 as well as the address conversion circuit 356.

Figure 14:
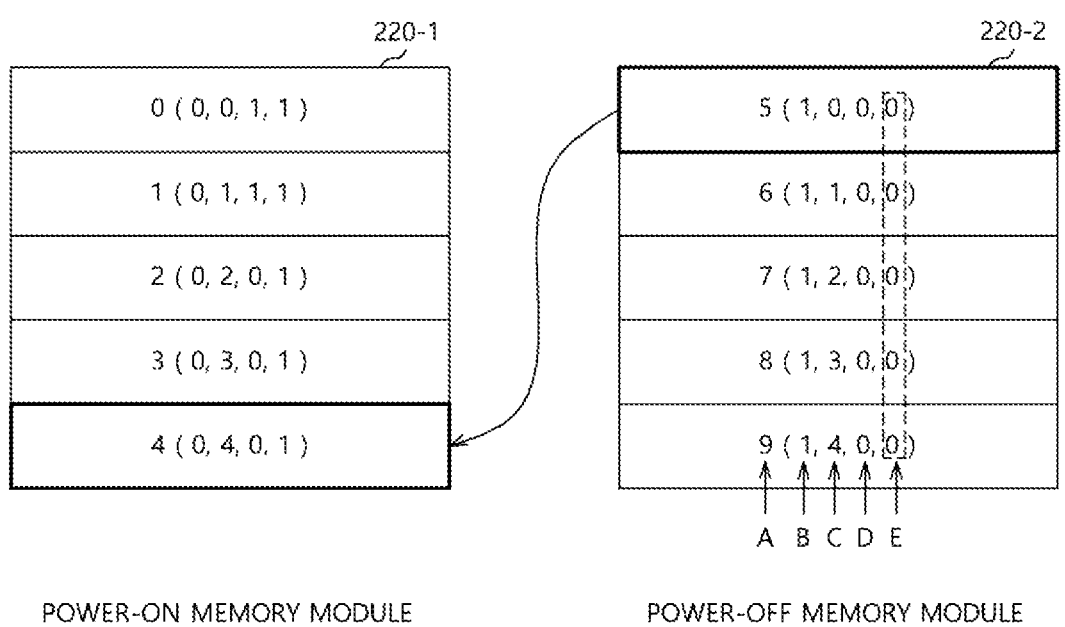
FIG. 14 is a view illustrating operations of an address conversion circuit in accordance with an embodiment.

FIG. 14 is a view illustrating operations of the address conversion circuit 356 in accordance with an embodiment. For example, the FIG. 14 shows the powered-on memory module 220-1 including five pages and the powered-off memory module 220-2 including five pages.

When the request REQUEST includes a memory operation command for a first page of the second memory module 220-2 corresponding to the page address having the value of 5(1, 0, 0, 0) that is stored in a sixth page of the mapping component 340, the address conversion circuit 356 may determine whether the memory module 220-2 corresponding to the sixth page of the mapping component 340 is a powered-off memory module or not using the page address information PA (i.e., "5(1, 0, 0, 0)") of the sixth page in the mapping component 340.

When the sixth page of the mapping component 340 indicates the powered-off memory module 220-2, the address conversion circuit 356 may change the physical address information AI for selecting an empty page in a powered-on memory module 220-1 in place of the powered-off memory module. The address conversion circuit 356 may transmit the changed physical address information AI to the memory interface 360.

In contrast, when a page of the mapping component 340 indicates a powered-on memory module, the address conversion circuit 356 may transmit the physical address information AI to the memory interface 360 through a normal physical address generation process.

Referring back to FIGS. 12 and 13, in step S18, the memory interface 360 may receive the physical address information AI (see ⑨ of FIG. 12) and the data from the data input/output component 380 (see ⑩ of FIG. 12). The memory interface 360 may change the physical address information AI into an internal address signal. The memory interface 360 may then output, together with the data provided from the data input/output component 380, the internal address signal as the first control signal CON1 for operating the memory modules (see ⑪ of FIG. 12).

Second Sequence: Method of Driving a Powered-Off Memory Module

Figure 15:
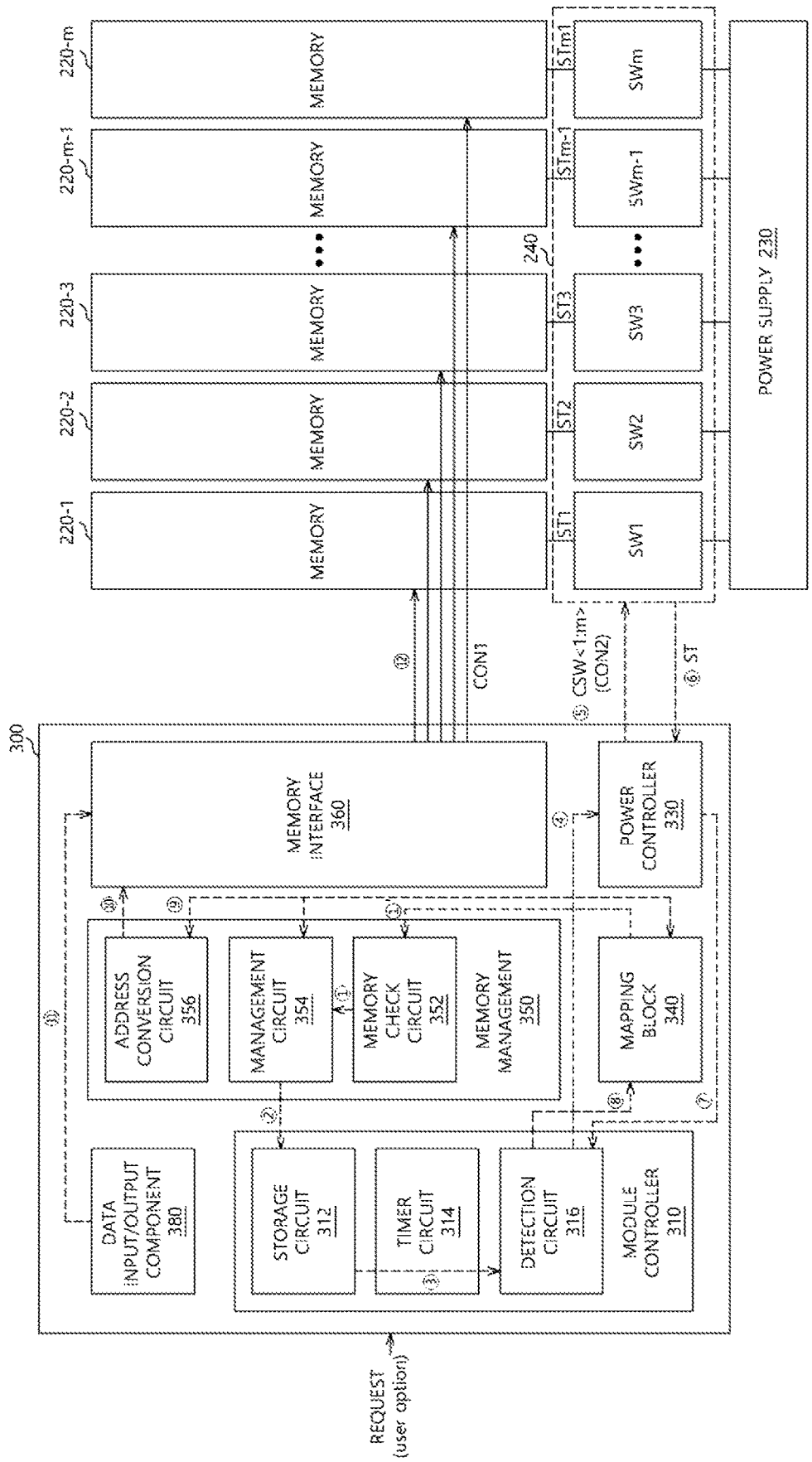
FIG. 15 is a block diagram illustrating a sequence for driving a powered-off memory module in accordance with an embodiment.
Figure 16:
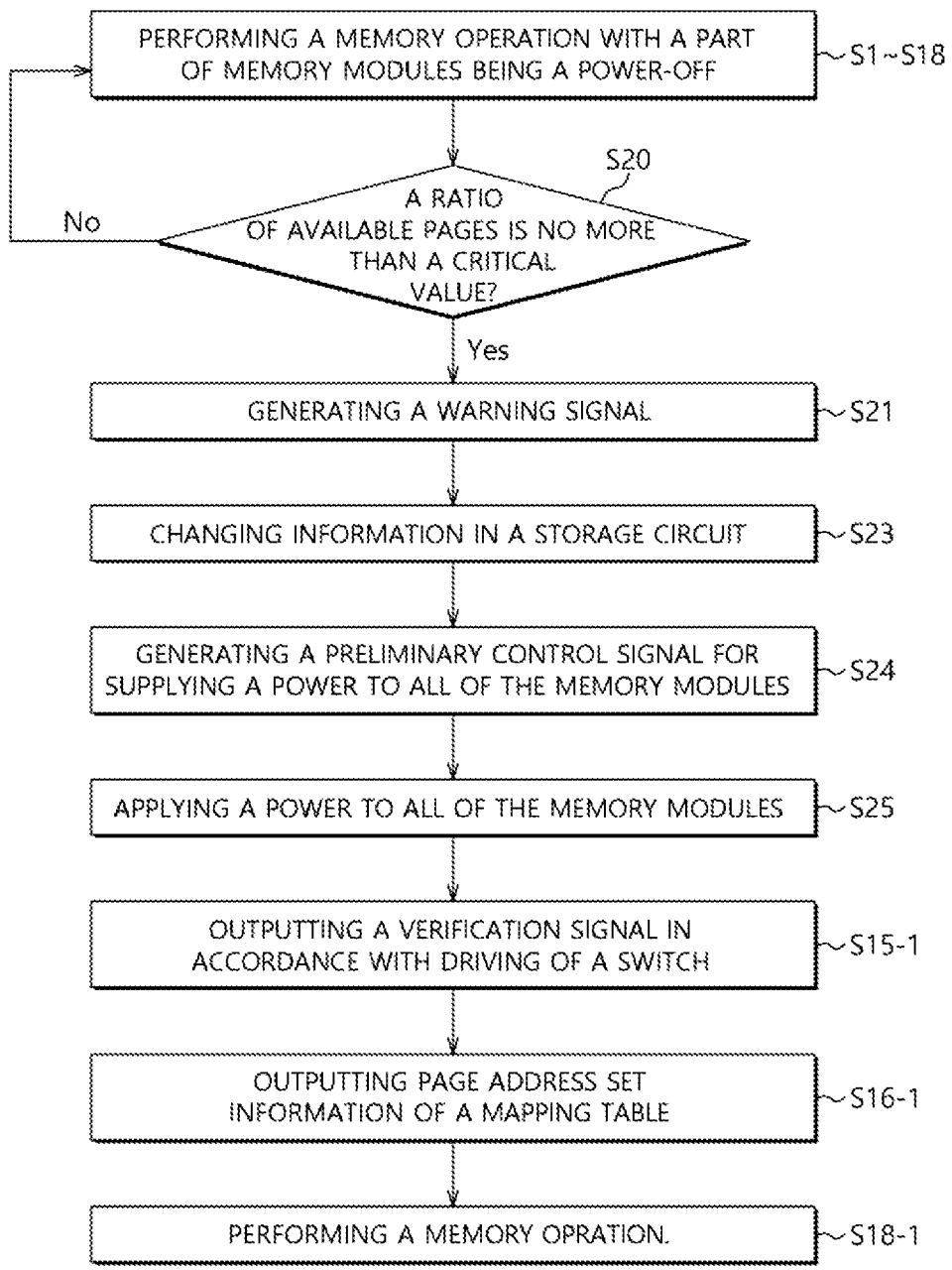
FIG. 16 is a flow chart describing operations for driving a powered-off memory module in accordance with an embodiment.

FIG. 15 is a block diagram illustrating a sequence for driving a powered-off memory module in accordance with an embodiment, and FIG. 16 is a flow chart describing operations for driving a powered-off memory module in accordance with an embodiment.

In the embodiment shown in FIGS. 15 and 16, it is assumed that the power is supplied to about 70% of the total memory modules 220-1 to 220-m in accordance with the user option signal.

Referring to FIGS. 15 and 16, the memory check circuit 352 of the memory management component 350 may count and monitor a number of the available pages of the powered-on ones among the memory modules 220-1 to 220-m based on the page address information PA stored in the mapping component 340 (see ① ' of FIG. 15).

In step S21, when the ratio of the available pages in the powered-on ones among the memory modules 220-1 to 220-m is no more than the critical value (that is, "Yes" at step S20), for example, about 30%, the memory check circuit 352 may output the warning signal Swa to the management circuit 354 (see ① of FIG. 15).

The memory modules 220-1 to 220-m may be divided into the K numbers of pages 0 to K−1 and may be controlled page by page, as illustrated in FIG. 10. When the ratio of the available pages to all pages in the powered-on memory modules among the memory modules 220-1 to 220-m is no more than the critical value, the memory check circuit 352 may output the warning signal Swa for awakening the powered-off memory module in order to perform subsequent operations effectively. In contrast, when the ratio of the available pages to all pages in the powered-on memory modules among the memory modules 220-1 to 220-m exceeds the critical value (that is, "No" at step S20), steps S1 to S18 may be performed while the powered-off memory modules remain powered-off. When the warning signal Swa is inputted, the management circuit 354 may output to the storage circuit 312 the first power control signal C_E1 for changing the information in the storage circuit 312 (see ② of FIG. 15).

In step S23, the storage circuit 312 may change the output levels of the storage signals M1 to Mm in response to the first power control signal C_E1 to power on all the memory modules 220-1 to 220-m. The changed storage signals M1 to Mm may be provided to the detection circuit 316 (see ③ of FIG. 15).

In step S24, the detection circuit 316 may process the changed storage signals M1 to Mm to generate the preliminary control signal Pre_CON2 to power on the memory modules 220-1 to 220-m. The preliminary control signal Pre_CON2 may then be transmitted to the power controller 330 (see ④ of FIG. 15). The power controller 330 may generate the switch drive signal CSW<1:m> for turning-on all of the switches SW1 to SWm in response to the preliminary control signal Pre_CON2. The power controller 330 may transmit the switch drive signal CSW<1:m> to the selection component 240 (see ⑤ of FIG. 15).

In step S25, all of the switches SW1 to SWm may be turned-on by the switch drive signal CSW<1:m> so that the memory modules 220-1 to 220-m receive the power supply voltages VA, VB and VC from the power supply 230.

The selection component 240 may provide the power controller 330 with the switch on/off information ST of the switches SW1 to SWm (see ⑥ of FIG. 15).

In step S15-1, the power controller 330 may decode the switch on/off information ST of the switches SW1 to SWm.

The power controller 330 may then transmit the decoded switch on/off information ST as the verification signal Sv to the detection circuit 316 ((7) of FIG. 15). The verification circuit 316b of the detection circuit 316 may buffer the verification signal Sv. The verification circuit 316b may output to the mapping component 340 the buffered verification signal Sv as the power information signal Sp for updating the mapping component 340 (see (8) of FIG. 15).

In step S16-1, the mapping component 340 may set the page address information PA on the mapping tables 340-1 to 340m based on the power information signal Sp. That is, the mapping component 340 may update the variable E of the page addresses in the mapping component 340-1 to 340-m of the mapping tables 340 into "1".

The updated page address information PA may be transmitted to the management circuit 354 and the address conversion circuit 356 of the memory management component 350 (see (9) of FIG. 15). The address conversion circuit 356 may receive the logical address information in the request REQUEST and the changed page address information PA to generate the physical address information AI. The address conversion circuit 356 may transmit the physical address information AI to the memory interface 360 (see (10) of FIG. 15).

Further to the physical address information AI from the address conversion circuit 356, the memory interface 360 may receive the data from the data input/output component 380 (see (11) of FIG. 15). The memory interface 360 may change the physical address information AI into the internal address signal. The memory interface 360 may then output, together with the data provided from the data input/output component 380, the internal address signal as the first control signal CON1 for operating the memory modules (see (12) of FIG. 15).

Thus, in step S18-1, the memory operation may be performed on the selected page of the memory modules 220-1 to 220-m.

Figure 17:
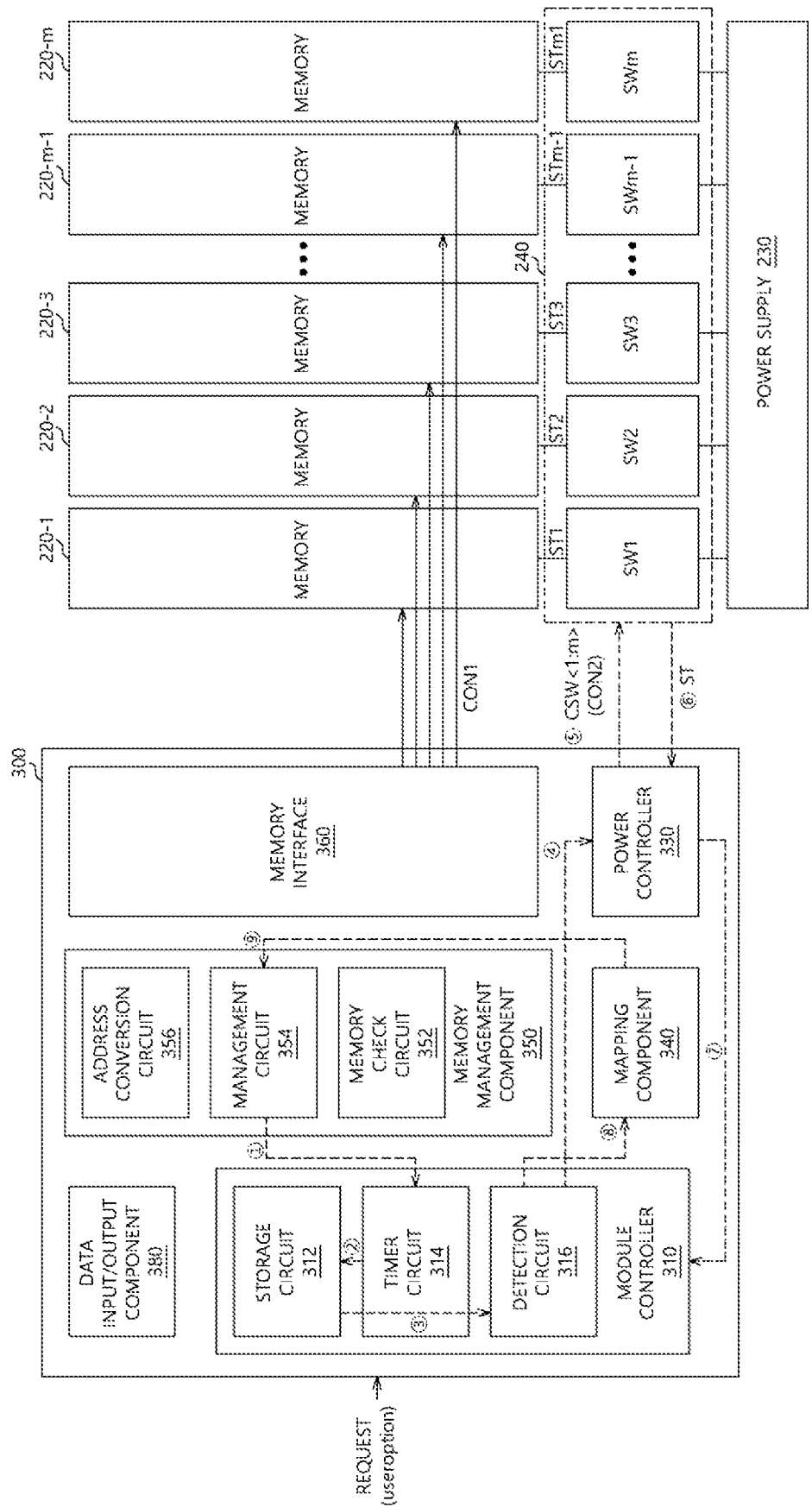
FIG. 17 is a block diagram illustrating a sequence for cutting a power to a powered-on but idle memory module in accordance with an embodiment.
Figure 18:
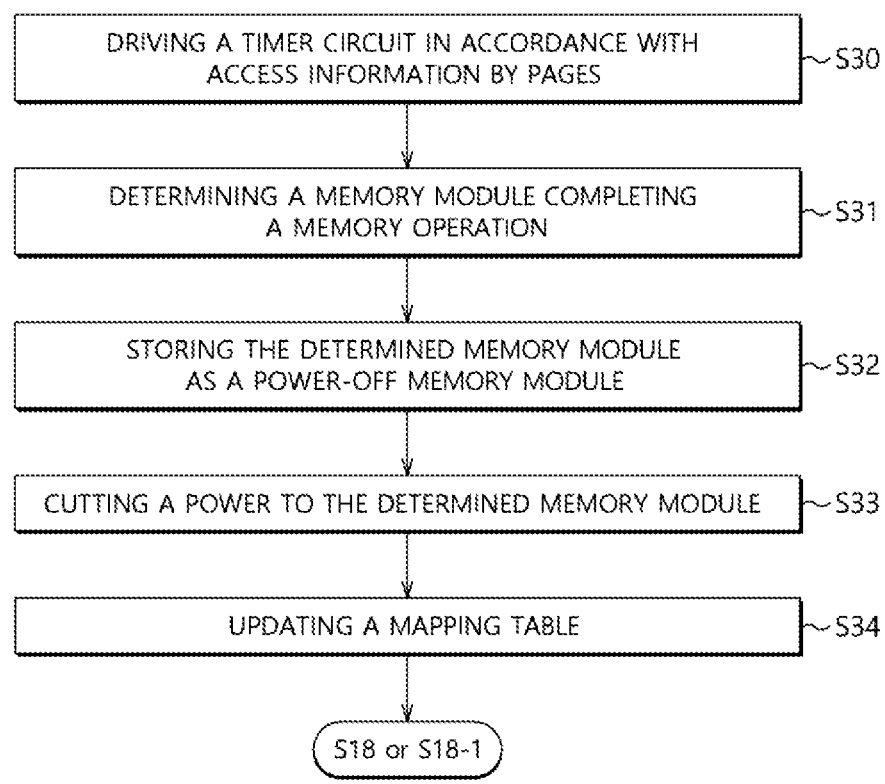
FIG. 18 is a flow chart describing operations for cutting a power to a powered-on but idle memory module in accordance with an embodiment.

Third Sequence: Method of Cutting a Power to a Powered-On But Idle Memory Module FIG. 17 is a block diagram illustrating a sequence for cutting a power to a powered-on but idle memory module in accordance with an embodiment, and FIG. 18 is a flow chart describing operations for cutting a power to a powered-on but idle memory module in accordance with an embodiment.

The third sequence may be derived from the operations of the first and second sequences. The third sequence may be initiated after the page address information PA is inputted into the management circuit 354 from the mapping component 340.

The management circuit 354 may generate the timer drive signal T_E in accordance with the page address information PA. The management circuit 354 may then provide the timer circuit 314 with the timer drive signal T_E (see (1) of FIG. 17). For example, when the change of the variable D in the page address information PA is detected, the management circuit 354 may determine the page of the corresponding memory modules 220-1 to 220-m as accessed or may determine the page access information PAI as changed. The management circuit 354 may then output the timer drive signal T_E to the timer circuit 314.

In step S30, the timer circuit 314 may be driven in response to the timer drive signal T_E.

In step S31, when the timer drive signal T_E in accordance with an additional page access information PAI is not inputted into the timer circuit 314 during the set time, the memory operation of the corresponding memory modules 220-1 to 220-m may be determined as completed. The timer circuit 314 may transmit the information of the memory modules 220-1 to 220-m, operations of which are determined as completed, as the second power control signal C_E2 to the storage circuit 312 (see (2) of FIG. 17).

In step S32, the storage circuit 312 may receive the second power control signal C_E2 including the information of the memory modules, operations of which are determined as completed among the memory modules 220-1 to 220-m. The storage circuit 312 may update the storage signals M1 to Mm to define the memory modules, operations of which are determined as completed among the memory modules 220-1 to 220-m, as a "to-be-powered-off" memory module. That is, the storage circuit 312 may change and store the levels of the storage signals M1 to Mm for representing memory modules, operations of which are determined as completed among the memory modules 220-1 to 220-m.

The detection circuit 316 may receive the updated storage signals M1 to Mm from the storage circuit 312 to generate the preliminary control signal Pre_CON2 (see (3) of FIG. 17). The detection circuit 316 may provide the power controller 330 with the preliminary control signal Pre_CON2 (see (4) of FIG. 17).

The power controller 330 may generate the switch drive signal CSW<1:m> for turning-off the switches SW1 to SWm corresponding to the memory modules, operations of which are determined as completed among the memory modules 220-1 to 220-m, in response to the preliminary control signal Pre_CON2. The power controller 330 may then output the switch drive signal CSW<1:m> to the selection component 240 (see (5) of FIG. 17).

In step S33, the switches SW1 to SWm may be selectively drive in response to the switch drive signal CSW<1:m> so that the power may be cut from the powered-off memory module classified by the user option signal and the "to-be-powered-off" memory modules, operations of which are determined as completed, among the memory modules 220-1 to 220-m.

The selection component 240 may provide the power controller 330 with the switch on/off information ST of the switches SW1 to SWm (see (6) of FIG. 17). The power controller 330 may decode the switch on/off information ST of the switches SW1 to SWm. The power controller 330 may then provide the detection circuit 316 with the decoded information as the verification signal Sv (see (7) of FIG. 17).

The verification circuit 316b of the detection circuit 316 may buffer the verification signal Sv. The verification circuit 316b may output to the mapping component 340 the buffered verification signal Sv as the power information signal Sp for updating the mapping component 340 (see (8) of FIG. 17).

In step S34, the mapping component 340 may update the page address information PA on the mapping tables 340-1 to 340m based on the power information signal Sp. That is, the mapping component 340 may update the variable E of the page addresses in the mapping tables 340-1 to 340-m of the mapping component 340 into "0" based on the power information signal Sp.

The mapping component 340 may provide the management circuit 354 with the changed page address information PA (see (9) of FIG. 17). Then, the mapping component 340 may perform subsequent memory operations, as described with reference to step S18 and S18-1 of FIGS. 13 and 16.

According to various exemplary embodiments, when the memory board such as a pulled memory device including the memory modules is driven in the power-up mode, the power may be supplied to one or more of the memory modules and the power may not be supplied to the remaining memory modules. All of the memory modules in the memory board may not be simultaneously used in the power-up mode so that the power consumption may be decreased by cutting the power of the idle memory modules.

Further, the ratio of the available pages in the powered-on memory modules may be detected. When the ratio of the available pages reaches the critical value, the power may be supplied to the powered-off memory modules. Therefore, the memory board may have improved usage efficiency.

Furthermore, when an additional page access does not occur to a powered-on memory module in a set time after previous page access to the powered-on memory module, the memory operation of the powered-on memory module may be determined as completed and the powered-on memory module may be regarded as a "to-be-powered-off" memory module. Thus, the power may not be supplied to the "to-be-powered-off" memory module, operations of which are determined as completed, to reduce the additional power consumption.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method of operating a data processing system including a plurality of memory modules, each of the plurality of memory modules including a plurality of pages, and the data processing system including a timer, the method comprising:
    classifying the plurality of memory modules into at least one power-on memory module and at least one power-off memory module based on a request;
    providing power to the power-on memory module and blocking the power from the power-off memory module based on the request;
    remapping an address to access a page of the power-on memory module instead of a page of the power-off memory module when the page of the power-off memory module is accessed;
    resetting the power-on memory module to the power-off memory module when all pages of the power-on memory module are not accessed for a set time using the timer, wherein the power-on memory module prior to reset comprises an idle memory module; and
    blocking the power from the reset power-off memory module in which all pages are not accessed for the set time.

2. The method of claim 1, wherein the request includes an initial setting condition to provide the power to some memory modules among the plurality of memory modules.

3. The method of claim 1, further comprising:
    resetting the power-off memory module to the power-on memory module when available pages of the power-on memory module are less than a threshold value.

4. The method of claim 3, further comprising:
    providing the power to the reset power-on memory module.

5. A method of operating a data processing system including a plurality of memory modules and a selection circuit including a plurality of switches configured to selectively provide power to at least one of the plurality of memory modules based on a control signal of a controller, and the data processing system including a timer, the method comprising:
    classifying the plurality of memory modules into at least one power-on module and at least one power-off module based on an initial option;
    generating a selection signal for selectively driving the selection circuit based on the control signal generated based on the initial option;
    providing the power to the power-on memory module and blocking the power from the power-off memory module based on the selection signal;
    remapping an address to access a storage region of the power-on memory module instead of a storage region of the power-off memory module when the storage region of the power-off memory module is accessed;
    resetting the power-on memory module to the power-off memory module when all storage regions of the power-on memory module are not accessed for a set time, using the timer, wherein the power-on memory module prior to reset comprises an idle memory module; and
    blocking the power from the reset power-off memory module.

6. The method of claim 5, wherein the initial option includes a ratio of the power-on module and the power-off module.

7. The method of claim 5, further comprising:
    resetting the power-off memory module to the power-on memory module when available storage regions of the power-on memory module are less than a threshold value; and
    providing the power to the reset power-on memory module.

* * * * *